United States Patent
Park

[19]

[11] Patent Number: 5,903,013
[45] Date of Patent: May 11, 1999

[54] THIN FILM TRANSISTOR AND METHOD OF MANUFACTURING THE SAME

[75] Inventor: Sung Kge Park, Chungcheongbuk-do, Rep. of Korea

[73] Assignee: LG Semicon Co., Ltd., Chungcheongbuk-do, Rep. of Korea

[21] Appl. No.: 08/751,240

[22] Filed: Nov. 18, 1996

[30] Foreign Application Priority Data

Dec. 26, 1995 [KR] Rep. of Korea ................ 1995-56311

[51] Int. Cl.⁶ .................... H01L 29/04; H01L 31/036; H01L 31/0376; H01L 31/20
[52] U.S. Cl. ................ 257/57; 257/349; 257/59; 438/159; 438/151
[58] Field of Search .................... 438/151, 163, 438/159, 302, 585; 257/59, 66, 9, 219, 57, 349

[56] References Cited

U.S. PATENT DOCUMENTS

| | | |
|---|---|---|
| 5,430,320 | 7/1995 | Lee ........................... 257/412 |
| 5,432,102 | 7/1995 | Cho et al. .................. 437/21 |
| 5,470,776 | 11/1995 | Ryou ......................... 437/52 |
| 5,612,234 | 3/1997 | Ha ............................. 437/40 |
| 5,766,988 | 6/1998 | Cho et al. .................. 438/151 |

OTHER PUBLICATIONS

C.T. Liu et al., High Reliability and High Performance 0.35μm Gate–Inverted TFT's for 16Mbit SRAM Applications Using Self–Aligned LDD.

*Primary Examiner*—Charles Bowers
*Assistant Examiner*—Scott J. Hawranek
*Attorney, Agent, or Firm*—Finnegan, Henderson, Farabow, Garrett & Dunner, L.L.P.

[57] ABSTRACT

A thin film transistor includes a substrate, a gate electrode formed on the substrate, and including opposing edge portions and a middle portion. An insulating film is formed on the surface of the gate electrode having a greater thickness on one of the gate edge portions. An active region is formed on the surface of the insulating film and the exposed substrate. The active region includes an off-set region, a channel region, a source region, and a drain region.

6 Claims, 8 Drawing Sheets

F I G.5a
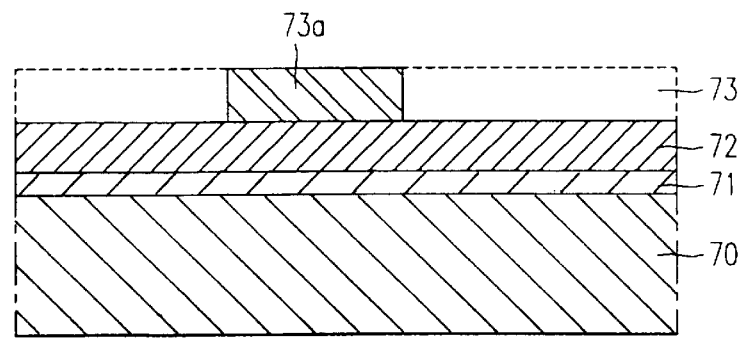
F I G.5b
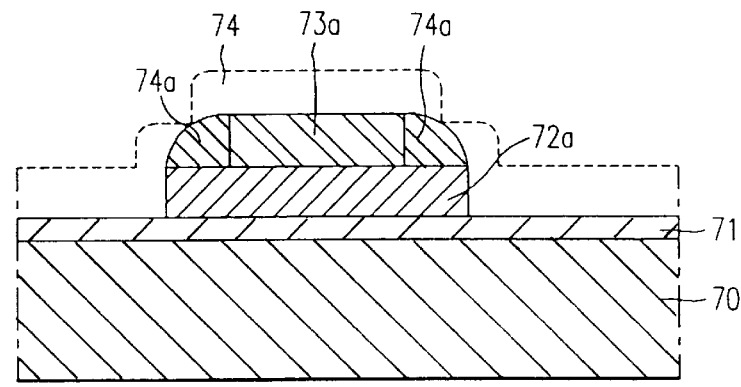
F I G.5c
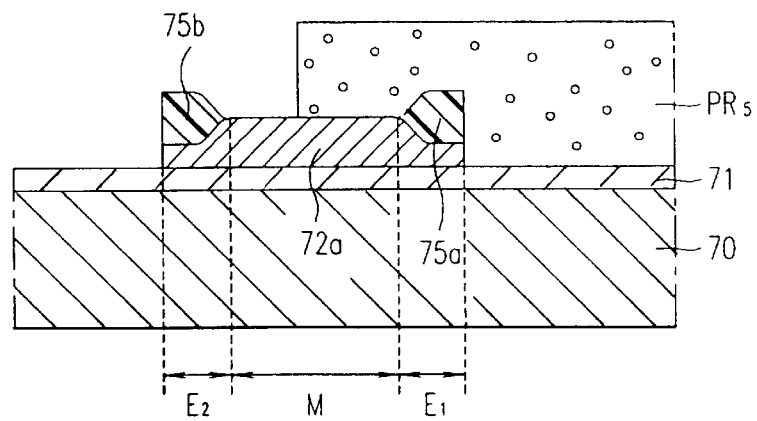

ize: /* huge text block */

THIN FILM TRANSISTOR AND METHOD OF MANUFACTURING THE SAME

BACKGROUND OF THE INVENTION

The present invention relates to a thin film transistor and a method of manufacturing the same. More particularly, the present invention relates to a thin film transistor which is suitable for incorporation into a static random access memory (SRAM).

In general, thin film transistors may be used instead of load resistors in SRAMs having densities exceeding 1 megabit. Thin film transistors are also widely used as switching elements for switching image data signals in pixel regions of a liquid crystal display device.

Ideally, in either application, the off current of the thin film transistor should be low, while on current should be high in order to reduce power consumption and improve memory characteristics. That is, the thin film transistor should have a high on/off current ratios.

Much research has focused on achieving a thin film transistor with improved on/off current ratios.

A method for manufacturing a thin film transistor in an attempt to achieve an improved on/off current ratio is shown in FIGS. 1a–1e. In particular, these figures illustrate processing steps for manufacturing a conventional bottom gate thin film transistor on a semiconductor substrate.

As shown in FIG. 1a, a first insulating film 2 is formed on a semiconductor substrate 1. After depositing a polysilicon layer 3 on first insulating film 2, polysilicon layer 3 is patterned by conventional photolithography and etching techniques according to a gate mask, thereby forming a gate electrode 3a.

As shown in FIG. 1b, through a chemical vapor deposition (CVD) method, a gate insulating film 4 and a polysilicon body layer 5 are successively deposited on the entire exposed surface of gate electrode 3a and first insulating film 2. Then, during a 24 hour heat treatment growth step, the wafer is subjected to a temperature of approximately 600° C. As a result, the grain size of polysilicon layer 5 is enlarged.

As shown in FIG. 1c, a photoresist film is next coated on body polysilicon layer 5 and patterned by conventional exposure and development processes to form a photoresist pattern $PR_1$, which masks a channel region. At this time, with photoresist pattern $PR_1$ serving as an ion-implantation mask, impurity ions are implanted into the exposed body of polysilicon layer 5, thereby forming source region 6a and drain region 6b (FIG. 1d).

Accordingly, where the impurity ions are not implanted in polysilicon body layer 5, a channel region A is formed, while another region between gate electrode 3a and drain region 6b serves as off-set region B.

As shown in FIG. 1e, after removing photoresist pattern $PR_1$, a second insulating film 7 is formed on the entire surface of channel region A, off-set region B, source region 6a and drain region 6b. Second insulating film 7 is then patterned to form contact holes to source region 6a and drain region 6b, respectively. Then, the contact holes are filled with a conductor to thereby form a source electrode 8 and a drain electrode 9 as wiring electrodes.

The operation principle of such conventional thin film transistor is as follows.

To begin with, if the transistor shown in FIG. 1e is a P-type MOS thin film transistor, channel region A has n conductivity, and source region 6a and drain region 6b have p conductivity. Accordingly, if a negative voltage is applied to gate electrode 3a relative to source region 6a, holes accumulate in channel region A, thereby forming a channel. If a negative voltage is applied to drain region 6b relative to source region 6a, a current flows between source region 6a and drain region 6b, due to the potential difference between the source and drain. However, if no voltage is applied to gate electrode 3a, a channel is not formed, and current is disrupted.

As shown in FIGS. 1a to 1e, channel region A and offset region B are both defined using photoresist pattern $PR_1$. However, if photoresist pattern $PR_1$ is misaligned, high off-current can result, thereby reducing reliability of the above-described thin-film transistor.

Further, while the conductivity of off-set region B is adjusted in order to decrease the off-current, the conductivity of region B is not affected by the potential on gate electrode 3a. Thus, the series resistance is increased, causing drain current drivability to deteriorate.

SUMMARY OF THE INVENTION

In order to solve the aforementioned problems, it is an object of the present invention to provide a thin film transistor and a method of manufacturing the same which has an off-set region of uniform length by using a self-alignment method, thereby improving a reliability of the thin film transistor.

It is another object of the present invention to provide a thin film transistor and a method of manufacturing the same, in which the potential of an off-set region is controlled by a gate electrode voltage, thereby improving on-current According to one aspect of the present invention to accomplish the above objects, there is provided a thin film transistor comprising a substrate; a gate electrode formed on the substrate and divided into both edge parts and a mid part. An insulating film is formed on the surface of the gate electrode having a thickness on one of the edge parts of the gate electrode that is greater than that on the mid part and the other edge part. In addition, an active region is formed on the surface of the insulating film and the exposed substrate including an off-set region disposed so as to correspond to a channel region, a source region, a drain region and one edge part of the gate electrode.

According to another aspect of the present invention to accomplish the above objects, there is provided a method of manufacturing a thin film transistor, comprising the steps of: forming a conductive layer on a substrate and patterning the conductive layer to thereby form a gate electrode; defining the gate electrode as two edge parts and a mid part therebetween; forming a gate insulating layer on the surface of the gate electrode and the substrate and forming an insulating layer on the gate insulating layer; patterning the insulating layer to thereby remove only a portion on one edge part of the electrode; forming a semiconductor layer as an active region on the remained part of the insulating layer and the entire surface of the gate insulating layer; and implanting an impurity ion after masking a portion corresponding to the mid part and one edge part of the gate electrode, to there by form a source and a drain on opposite sides of the gate electrode, respectively.

According to another aspect of the present invention to accomplish the above objects, there is provided a method of manufacturing a thin film transistor, comprising the steps of: sequentially forming a conductive layer and a first insulating layer on the surface of a substrate; patterning the first insulating layer to thereby form a first insulating layer pattern having a predetermined width; forming a second insulating layer on the surface of the conductive layer and the first insulating layer pattern and etching the second insulating layer to thereby form sidewall spacers on both sidewalls of the first insulating layer pattern; etching the conductive layer using the first insulating layer pattern and the sidewall spacers as an etch mask, to thereby form a gate electrode; removing the sidewall spacers and growing side insulating films on both sides of the exposed gate electrode; removing one of the side insulating films and forming a third insulating layer on the surface of the gate electrode and the other side insulating film; forming an active region on the surface of the substrate and the third insulating layer; forming an impurity-containing layer on the active region and etching back the impurity-containing layer until the surface of the other side insulating film and the active region disposed between both sides insulating films are exposed; and diffusing the impurity from the impurity-containing layer to the active region by annealing, to thereby form a source and a drain.

BRIEF DESCRIPTION OF THE DRAWINGS

FIGS. 5a to 5e are cross-sectional views illustrating a method of manufacturing a thin film transistor according to the second embodiment of the present invention.

DETAILED DESCRIPTION OF THE INVENTION

Figure 1A:
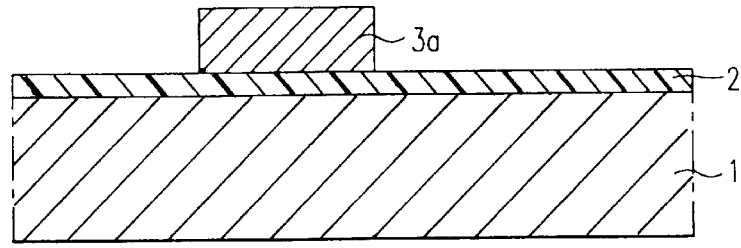
FIGS. 1a to 1e are cross sectional views illustrating a method of manufacturing a conventional thin film transistor.
Figure 1B:
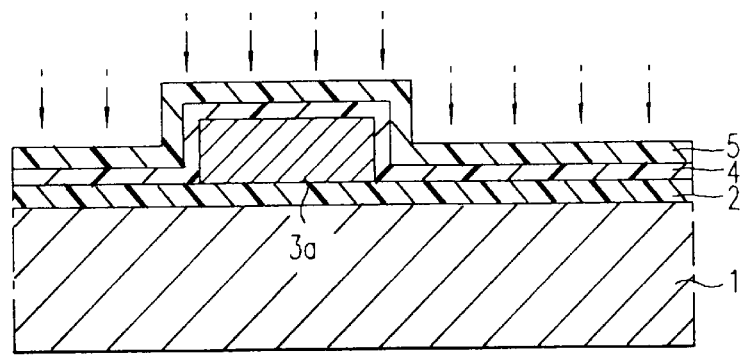
Figure 1C:
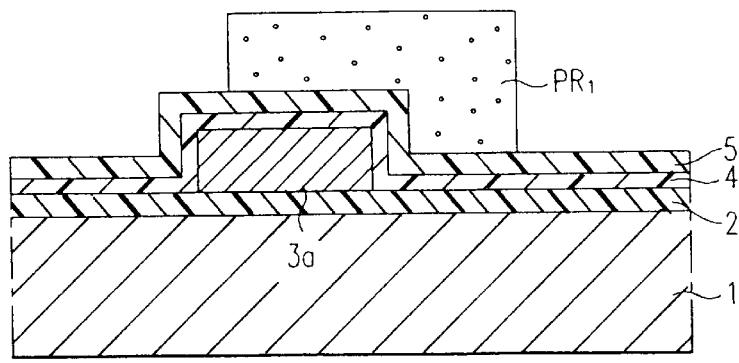
Figure 1D:
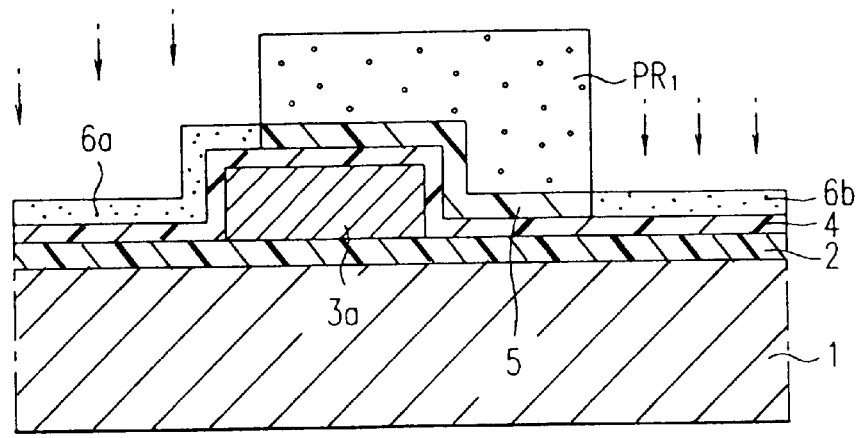
Figure 1E:
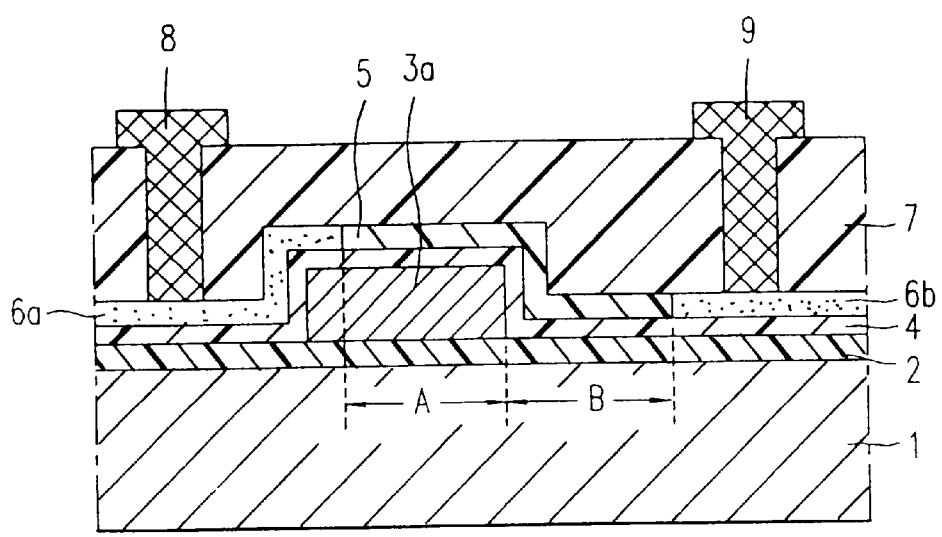
Figure 2A:
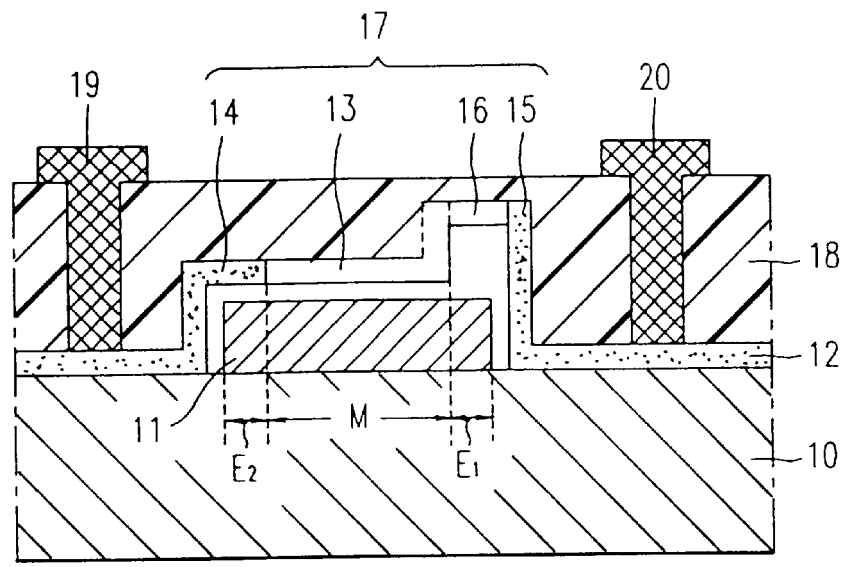
FIG. 2a is a cross-sectional view of a thin film transistor in accordance with a first embodiment of the present invention.
Figure 2B:
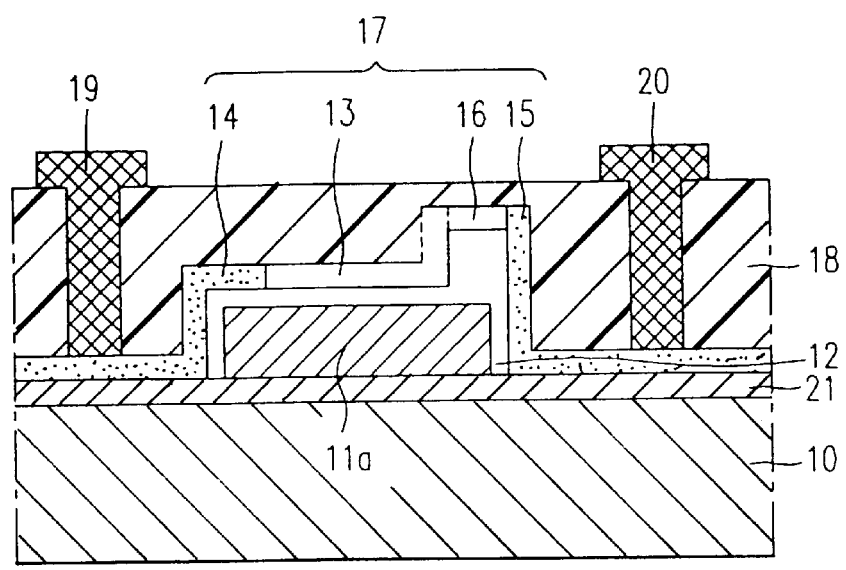
FIG. 2b is a cross-sectional view further illustrating the thin film transistor in accordance with the first embodiment of the present invention.

Hereinafter, embodiments of the present invention will be described with the reference to the attached drawings.
First Embodiment FIGS. 2a is a cross-sectional view of a thin film transistor (TFT) according to a first embodiment of the present invention, and exemplify a case in which the TFT is formed on an insulating substrate. FIG. 2b is a cross-sectional view of the thin film transistor according to the first embodiment of the present invention formed on a semiconductor substrate.

As shown in FIG. 2a, the thin film transistor includes a gate electrode 11 formed on insulating substrate 10 and divided into edge portions $E_1$ and $E_2$ and a mid portion M. An insulating film 12 is formed on the surface of gate electrode 11 having a thickness overlying edge portion $E_1$ which is greater than the thickness overlying edge portion $E_2$ and mid portion M. Active region 17 is formed on the surface of insulating film 12 and exposed insulating substrate 10 including offset region 16. Active region 17 includes channel region 13, source region 14, drain region 15 and edge portion $E_1$ of gate electrode 11.

As further shown in FIG. 2a, channel region 13 is formed on the surface of insulating film 12 above mid portion M of gate electrode 11, and source region 14 is formed on the surface of insulating substrate 10 above edge portion $E_2$ of gate electrode 11. In addition, drain region 15 is formed to one side of gate electrode 11 so as not to overlap gate electrode 11.

Further, the TFT further comprises an insulating film 18 formed on active region 17 having contact holes to source and drain regions 14 and 15, respectively. A source electrode 19 is formed in the source contact hole and a drain electrode 20 is formed in the drain contact hole.

The TFT shown in FIG. 2b is similar to the one shown in FIG. 2a, except the TFT of FIG 2b is formed on a semiconductor substrate 10a instead of an insulating substrate. Further, an insulating layer 21 is provided between semiconductor substrate 10a and gate electrode 11a, source region 14 and drain region 15 in order to electrically isolate the TFT from substrate 10.

Hereinafter, a method of manufacturing the thin film transistor according to the first embodiment on a polysilicon substrate will now be described with reference to FIGS. 3a to 3e.

It should be noted that the process for forming a TFT on an insulating substrate is the same as that shown in FIGS. 3a–3e, but omits the step of forming insulating layer 31.

Figure 3A:
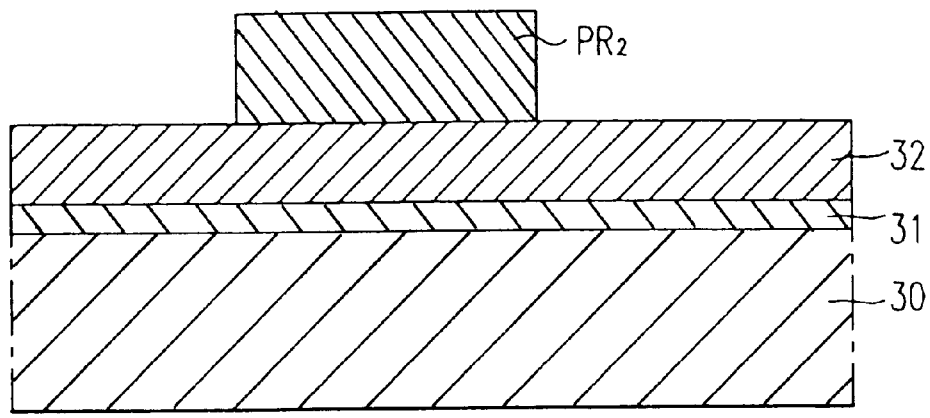
FIGS. 3a to 3e are cross-sectional views illustrating a method of manufacturing the thin film transistor accordance to the first embodiment of the present invention.

As shown in FIG. 3a, an insulating layer 31 and a conductive layer 32 are successively formed on a semiconductor substrate 30. Conductive layer 32 is then patterned using a photoresist pattern $PR_2$, thereby forming a gate electrode 32a.

Figure 3B:
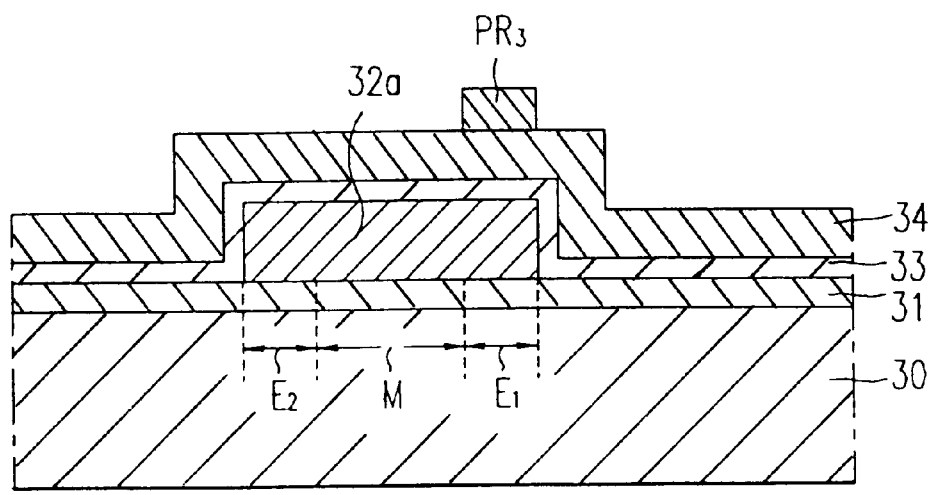

As shown in FIG. 3b, the upper surface of gate electrode 32 is defined including edge portions $E_1$ and $E_2$ and a mid portion M. Then, a gate insulating layer 33 and an insulating layer 34 are successively formed on the exposed surface of gate electrode 32a and insulating layer 31. A photoresist pattern $PR_3$ is coated on insulating layer 34 above portion $E_1$ of gate electrode 32a. Then, using photoresist pattern $PR_3$ as an etch mask, insulating layer 34 is patterned.

Figure 3C:
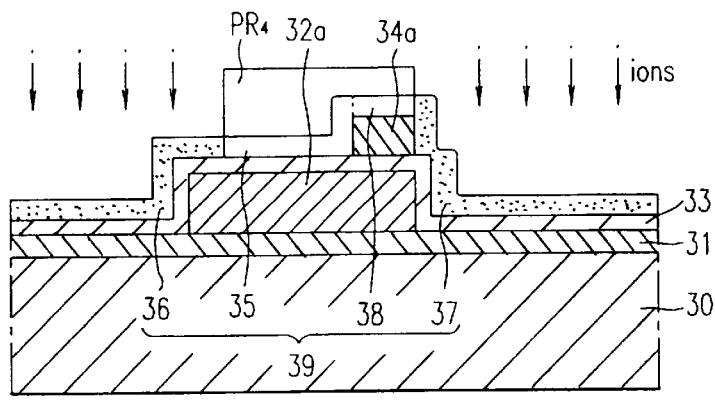

Thus, as shown in FIG. 3c, an insulating layer pattern 34a is left only on edge portion $E_1$ of gate electrode 32a, while the rest of insulating layer 34 is removed.

A semiconductor layer, such as polysilicon serving as an active region 39, is then formed on the surface of insulating layer pattern 34a and exposed gate insulating layer 33. Thereafter, using a photoresist pattern $PR_4$, part of active region 39 corresponding to mid portion M and edge portion $E_1$ is masked, and impurity ions are implanted therein to thereby form a source region 36 and a drain region 37 at opposite sides of gate electrode 32a. As a result, the part of the active region 39 above mid portion M of gate electrode 32a serves as a channel region 35, and the part of active region 39 above edge portion $E_1$ serves as an off-set region 38.

Preferably, gate insulating layer 33 and insulating layer 34 may be formed by a chemical vapor deposition (CVD) of silicon oxide film ($SiO_2$) and a CVD of silicon nitride film ($Sl_3N_4$), respectively. Alternatively, silicon nitride may be laid down prior to silicon oxide. Further, the thickness of insulating layer 34 is formed so as to be much thicker than that of gate insulating film 33.

As described above, the process used to manufacture the thin film transistor shown in FIG. 2a differs from the one used to manufacture the transistor shown in FIG. 2b with respect to two steps. First, an insulating substrate is used instead of semiconductor substrate. Secondly, the step of forming insulating layer 31 in FIG. 3a is omitted.

Figure 3D:
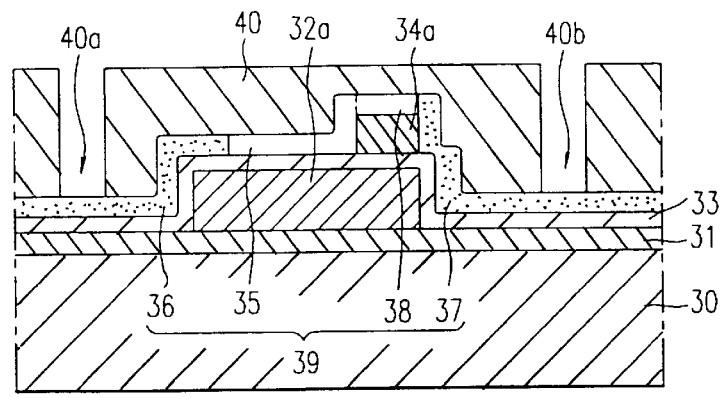

As shown in FIG. 3d, a planarizing insulating layer 40 is formed on the entire surface of active region 39 and patterned to form a source contact hole 40a and a drain contact hole 40b on source region 36 and drain region 37, respectively.

Figure 3E:
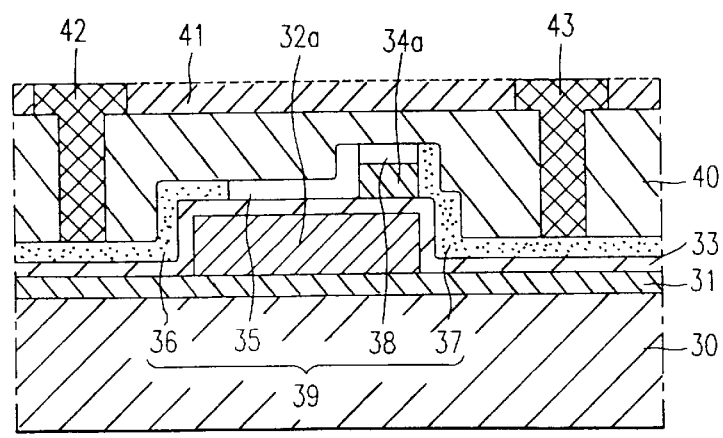

Finally, as shown in FIG. 3e, a planarizing conductive layer 41 is formed on contact holes 40a and 40b and insulating layer 40 for planarization so as to completely fill contact holes 40a and 40b. Then, conductive layer 41 is patterned to form a source electrode 42 and a drain electrode 43 on source contact hole 40a and drain contact hole 40b, respectively.

Second Embodiment

Hereinafter, a thin film transistor according to a second embodiment and a related manufacturing method will be described with reference to FIGS. 4 and 5.

Figure 4A:
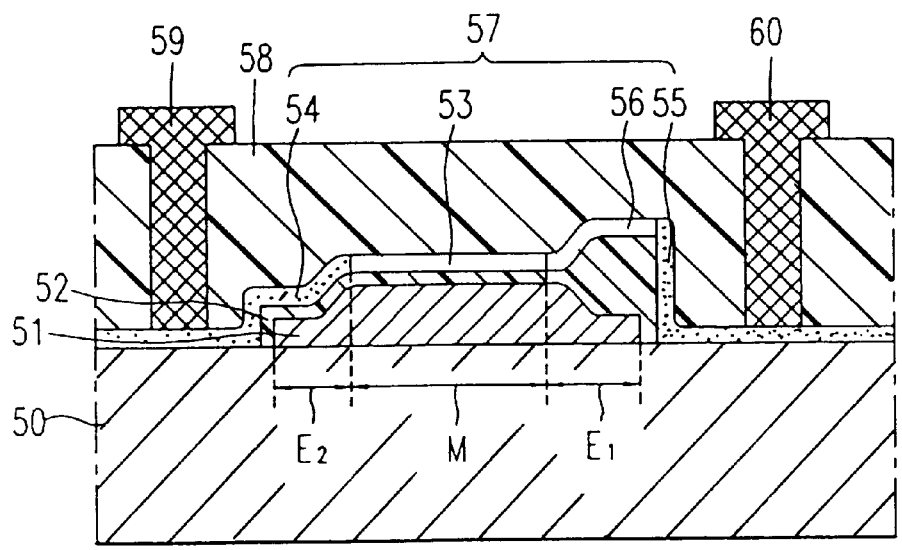
FIG. 4a is a cross-sectional view of a thin film transistor in accordance with a second embodiment of the present invention.

FIG. 4a is a cross-sectional view showing the structure of a TFT according to the second embodiment of the present invention, wherein the TFT is formed on an insulating substrate.

Figure 4B:
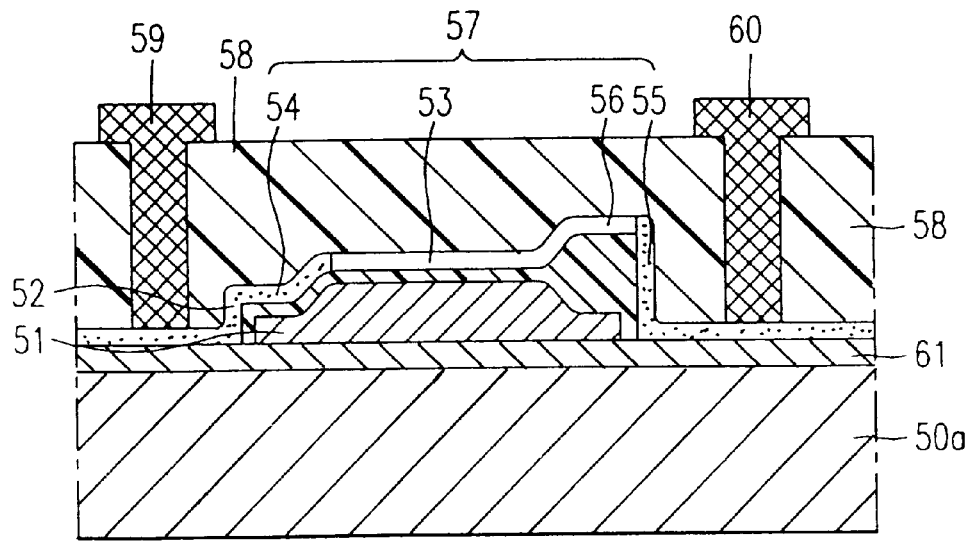
FIG. 4b is a cross-sectional view illustrating a further aspect of the thin film transistor according to the second embodiment of the present invention.

FIG. 4b is similar to FIG. 4a, except that a semiconductor substrate is used instead of an insulating substrate.

As shown in FIG. 4a, similarly to FIG. 2a, the TFT includes a gate electrode 51 formed on insulating substrate 50 having edge portions $E_1$ and $E_2$ and a mid portion M. An insulating film 52 is formed on the surface of gate electrode 51 having a greater thickness over edge portion $E_1$ than over mid portion M and edge portion $E_2$. An active region 57 is formed on the surface of insulating film 52 and exposed insulating substrate 50; the active region including an off-set region 56 corresponding to a channel region 53, a source region 54, a drain region 55 and edge portion $E_1$ of gate electrode 51.

The TFT shown in FIG. 4a is similar to that shown in FIG. 2a, however, portions $E_1$ and $E_2$ of the gate electrode of the TFT, in accordance with the second embodiment, have sloped surfaces slanted downwardly away from mid part M.

Further, like FIG. 2a, a channel region 53 is formed on insulating film 52 above mid portion M of gate electrode 51. Source region 54 is formed on the surface of insulating film 52 above edge portion $E_2$ of gate electrode 51 and on the surface of insulating substrate 50 beyond the side of gate electrode 51. Also, drain region 55 is formed on the surface of insulating substrate 50 beyond the other side of gate electrode 51.

In addition, as shown in FIG. 4a, the thin film transistor according to the second embodiment further comprises an insulating film 58 formed on active region 57 having a source contact hole and a drain contact hole overlying source region 54 and drain region 55, respectively. Further, a source electrode 59 is formed in the source contact hole, and a drain electrode 60 is formed in the drain contact hole.

FIG. 4b is similar to FIG. 4a, except that a semiconductor substrate 50a such as a polysilicon is used instead of insulating substrate 50 in FIG. 2a. Accordingly, since semiconductor substrate 50a is used in FIG. 4b, an insulating layer 61 is provided between gate electrode 51, source region 54 and drain region 55, and semiconductor substrate 50a for electrical isolation.

A method of manufacturing the thin film transistor according to the second embodiment will now be described with reference to FIGS. 5a to 5e, wherein the TFT is formed on a semiconductor substrate, preferably polysilicon.

As described in the first embodiment, the process for manufacturing the TFT on an insulating substrate is similar to that used to manufacture the TFT on a semiconductor substrate except the step of forming an insulating layer on the substrate is omitted.

As shown in FIG. 5a, a substrate insulating layer 71, a conductive polysilicon 72, and a first insulating layer 73 (preferably a CVD silicon nitride film) are successively formed on the entire surface of a semiconductor substrate 70. First insulating layer 73 is patterned using a mask for defining a gate, thereby forming a first insulating layer pattern 73a. Next, using first insulating layer pattern 73a and sidewall spacers 74a as an etch mask, conductive layer 72 is etched to form a conductive gate electrode pattern 72a.

As shown in FIG. 5b, a second insulating layer 74 (preferably a CVD silicon oxide film) is formed on the exposed surface of first insulating layer pattern 73a and conductive layer 72, and etched by reactive ion etching (RIE), thereby forming sidewall spacers 74a on the sidewalls of first insulating layer pattern 73a.

After removing sidewall spacers 74a, local oxidation is carried out at edge portions of gate electrode 72a exposed after removal of sidewall spacers 74a. As a result, insulating films 75a and 75b, which are thermal oxide films, are formed on both edge portions $E_1$ and $E_2$. Gate electrode 72a thus has a mesa structure. That is, each of edge parts $E_1$ and $E_2$ of gate electrode 72a has a slope slanted downwardly away from portion M. A photoresist pattern $PR_5$ is then provided on one of the edge portions of gate electrode 72 to selectively mask insulating film 75a, as shown in FIG. 5c.

Figure 5D:
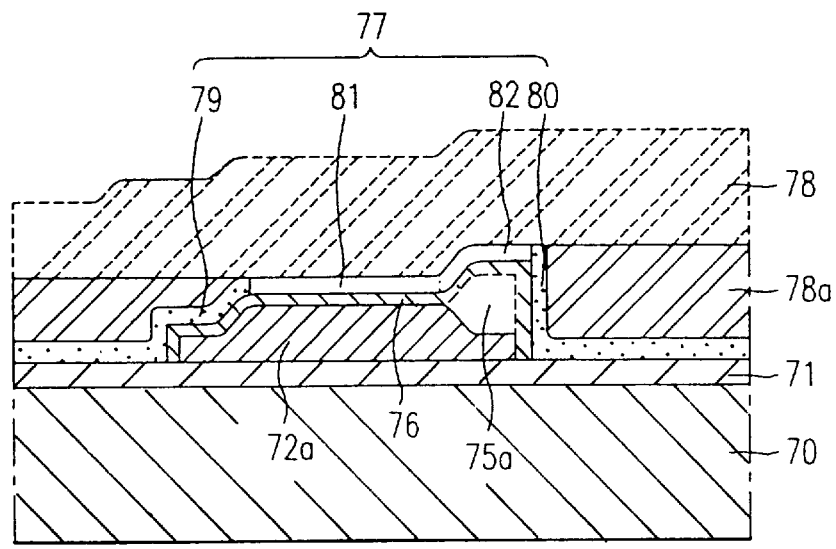

As shown in FIG. 5d, insulating film 75b disposed on the other edge part $E_2$ of gate electrode 72a, which is not masked by photoresist pattern $PR_5$, is removed, followed by removal of photoresist pattern $PR_5$. Here, insulating film 75a remaining on edge portion $E_1$ of gate insulating layer 78 underlies part of active region 77 (to be described below). Thereafter, a third insulating layer 75 (a gate insulating layer), a semiconductor layer (e.g., a polyslicon active region 77), and an impurity-doped insulating layer 78 are successively formed on insulating layer 71. Impurity-doped insulating layer 78 (preferably a boron silicate glass (BSG) or a boron phosphorous silicate glass (BPSG)) is etched to expose the surface of the mid portion M of gate electrode 7a facing part of active region 77 corresponding to the remaining portion of insulating film 75a. That is, parts of active region 77 used as channel and off-set regions are exposed, while other parts which will be used as a source region and a drain region are in contact with the impurity doped insulating layer 78a. Insulating film 75a is formed so as to be much thicker than that of third insulating layer 76 serving as the gate insulating layer.

The impurity doped insulating layer is then annealed to diffuse boron impurities from impurity doped insulating layer 78a into portions of active region 77 in contact with layer 78a to form source region 79 and drain region 80. Portions of active region 77 where the boron impurities did not diffuse correspond to channel region 81 and offset region 82 of the completed device. In particular, as shown in FIG. 5d, channel region 81 is disposed on mid portion M of gate electrode 72a, and offset region 82 overlies remaining insulating film 75a.

Figure 5E:
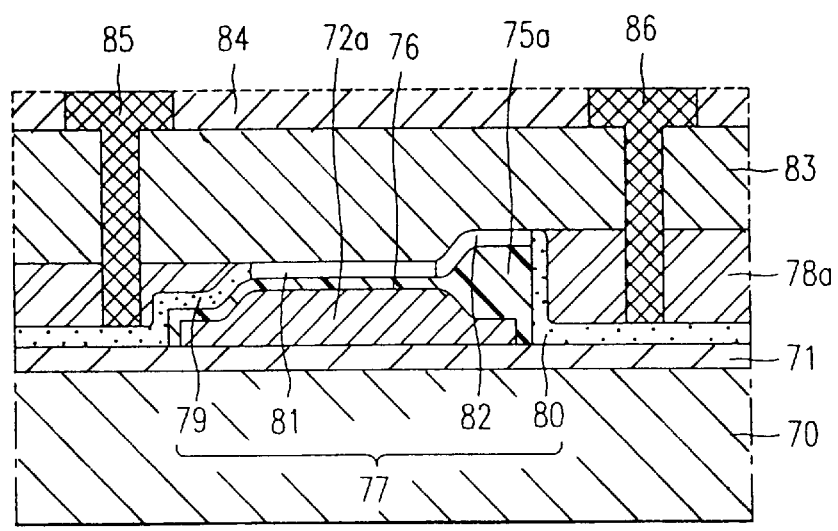

Thereafter, as shown in FIG. 5e, a fourth insulating layer 83 having a planarized surface is formed on remaining impurity-doped insulating layer 78 and an exposed part of active region 77. Remaining impurity-doped insulating layer 78a and fourth insulating layer 83 are then patterned together, thereby forming a source contact hole and drain contact hole on source region 79 and drain region 80, respectively.

A conductive layer 84 is then formed on the contact holes and on fourth insulating layer 83 so as to completely fill the source contact hole and drain contact hole. Conductive layer 84 is then patterned to thereby form a source electrode 85 and a drain electrode 86, which are connected with source region 79 and drain region 80, respectively.

Since the operation of the thin film transistor of the present invention is the same as that of the conventional thin film transistor, further description of the operation is omitted.

As described above, the structure and manufacturing process of the TFT's in accordance with the first and second embodiments of the present invention have the following advantages.

First, the potential of the off-set region is controlled by the gate electrode voltage. Thus, the on-current is enhanced in the "On" state. In the "Off" state, however, the electric field is diminished due to the thermal oxide film disposed below the off-set region. Accordingly, the off-current is decreased. As a result, the on/off current ratio is improved and performance of the TFT is enhanced.

Secondly, the self-alignment method of the second embodiment defining the off-set region uses a remaining portion of the insulating film. Thus, channel leakage current and variation of threshold voltage can be reduced.

Accordingly, the reliability of the thin film transistor is improved.

What is claimed is:

1. A thin film transistor comprising:

a substrate;

a gate electrode on said substrate having an upper surface and two side surfaces, said upper surface having a first edge portion, a second edge portion and a middle portion;

an insulating film on said upper surface and said two side surfaces, said insulating film having a first part overlying said first edge portion of said upper surface, and a second part overlying said middle and second edge portions of said upper surface, a thickness of said first part being greater than said second part; and an active region on a surface of said insulating film and said substrate, said active region including an off-set region, a channel region, a source region and a drain region, said off-set region overlying the first edge portion.

2. A thin film transistor as claimed in claim 1, wherein said channel region is formed on a part of said surface of said insulating film above said middle portion of said gate electrode;

said source region is formed on a part of said surface of said insulating film above said second edge portion of said gate electrode and on the surface of said substrate adjacent said second edge portion of said gate electrode; and said drain region is formed on a part of said surface of said substrate adjacent to first edge portion of said gate electrode.

3. A thin film transistor as claimed in claim 1, wherein said substrate includes material selected from a group of semiconductors and insulator material.

4. A thin film transistor as claimed in claim 1, further comprising an insulating layer formed between said substrate and said gate electrode, said source region and said drain region.

5. A thin film transistor as claimed in claim 1, further comprising an insulating film formed on said active region and having a source contact hole and a drain contact hole aligned with said source and drain regions, respectively;

a source electrode formed in said source contact hole; and a drain electrode formed in said drain contact hole.

6. A thin film transistor as claimed in claim 1, wherein each of said first and second edge portions of said gate electrode has a sloped surface slanted away from said middle portion.

* * * * *